US010748990B2

(12) United States Patent
Ando et al.

(10) Patent No.: US 10,748,990 B2
(45) Date of Patent: *Aug. 18, 2020

(54) STACKED INDIUM GALLIUM ARSENIDE NANOSHEETS ON SILICON WITH BOTTOM TRAPEZOID ISOLATION

(71) Applicant: INTERNATIONAL BUSINESS MACHINES CORPORATION, Armonk, NY (US)

(72) Inventors: Takashi Ando, Tuckahoe, NY (US); Pouya Hashemi, White Plains, NY (US); Mahmoud Khojasteh, Poughkeepsie, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/436,089

(22) Filed: Jun. 10, 2019

(65) Prior Publication Data
US 2019/0296106 A1   Sep. 26, 2019

Related U.S. Application Data

(63) Continuation of application No. 15/819,567, filed on Nov. 21, 2017, now Pat. No. 10,388,727.

(51) Int. Cl.
*H01L 27/12* (2006.01)
*H01L 29/06* (2006.01)
(Continued)

(52) U.S. Cl.
CPC .......... *H01L 29/0649* (2013.01); *B82Y 10/00* (2013.01); *H01L 21/0254* (2013.01);
(Continued)

(58) Field of Classification Search
None
See application file for complete search history.

(56) References Cited

U.S. PATENT DOCUMENTS 10,388,727 B2 * 8/2019 Ando .................. H01L 21/0254

OTHER PUBLICATIONS

List of IBM Patents or Patent Applications Treated as Related dated Jun. 10, 2019, 2 pages.
(Continued)

*Primary Examiner* — Calvin Y Choi
(74) *Attorney, Agent, or Firm* — Tutunjian & Bitetto, P.C.; L. Jeffrey Kelly

(57) ABSTRACT

A method of forming a nanosheet semiconductor device that includes epitaxially forming a stack of at least two repeating nanosheets, the at least two repeating nanosheets including a first nanosheet layer of a first III-V semiconductor material and a second nanosheet layer of a second III-V semiconductor material. A sacrificial gate structure is formed on the stack of the at least two repeating nanosheets. Source and drain regions are epitaxially formed on the second nanosheet layer. The sacrificial gate structure is removed to provide a gate opening. An etch process removes the first nanosheet layer selectively to the second nanosheet layer, wherein the etch process is selective to facets of the material for the first nanosheet layer to provide an inverted apex at the base of the stack. A dielectric layer is deposited filling the inverted apex. A functional gate structure is formed in the gate opening.

20 Claims, 8 Drawing Sheets

(51) Int. Cl.
*H01L 21/02* (2006.01)
*H01L 29/66* (2006.01)
*H01L 21/306* (2006.01)
*H01L 29/423* (2006.01)
*H01L 29/786* (2006.01)
*H01L 29/775* (2006.01)
*B82Y 10/00* (2011.01)
*H01L 29/08* (2006.01)
*H01L 29/10* (2006.01)
*H01L 29/40* (2006.01)

(52) U.S. Cl.
CPC .... *H01L 21/0262* (2013.01); *H01L 21/02381* (2013.01); *H01L 21/02433* (2013.01); *H01L 21/02543* (2013.01); *H01L 21/02546* (2013.01); *H01L 21/02576* (2013.01); *H01L 21/02579* (2013.01); *H01L 21/02603* (2013.01); *H01L 21/30617* (2013.01); *H01L 29/0653* (2013.01); *H01L 29/0673* (2013.01); *H01L 29/0847* (2013.01); *H01L 29/1079* (2013.01); *H01L 29/401* (2013.01); *H01L 29/42392* (2013.01); *H01L 29/66469* (2013.01); *H01L 29/66522* (2013.01); *H01L 29/66545* (2013.01); *H01L 29/66742* (2013.01); *H01L 29/775* (2013.01); *H01L 29/78618* (2013.01); *H01L 29/78681* (2013.01); *H01L 29/78696* (2013.01); *H01L 21/02373* (2013.01); *H01L 21/02458* (2013.01); *H01L 21/02461* (2013.01); *H01L 21/02507* (2013.01); *H01L 21/02639* (2013.01)

(56) References Cited

OTHER PUBLICATIONS

Waldron, N. et al., "Gate-All-Around InGaAs Nanowire FETS with Peak Transconductance of 2200µS/µm at 50nm Lg using a Replacement Fin RMG Flow" IEEE (Dec. 2015) pp. 31.1.1-31.1.4.

* cited by examiner

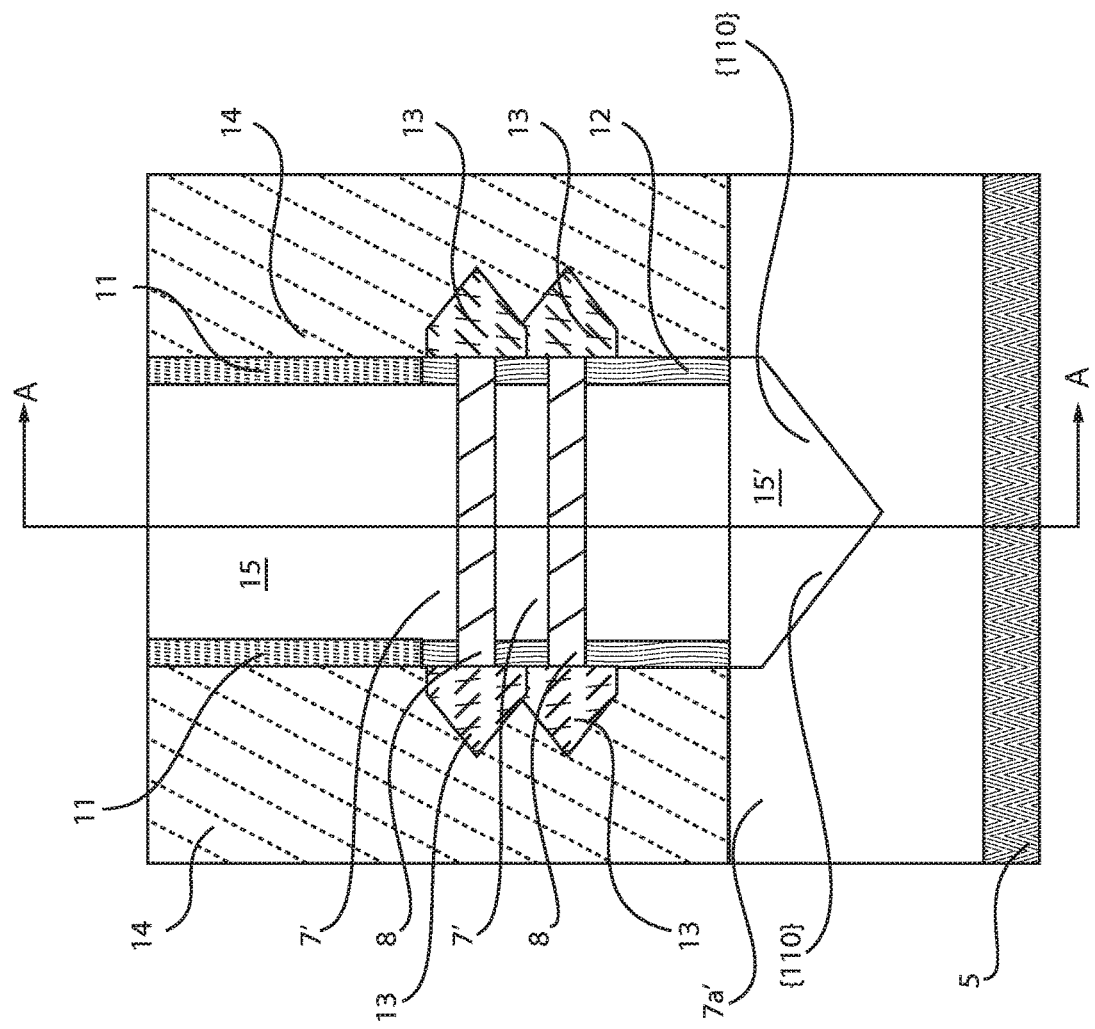
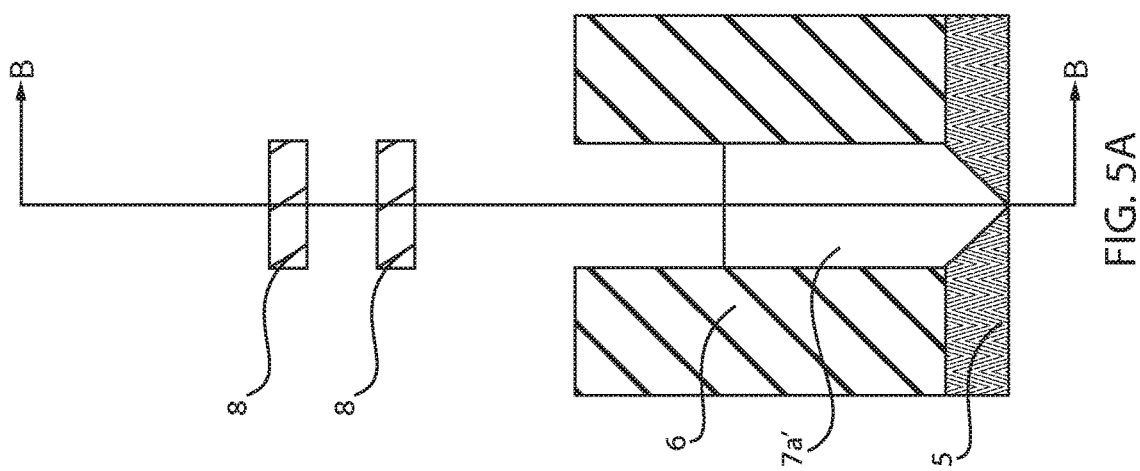
FIG. 5A
FIG. 5B

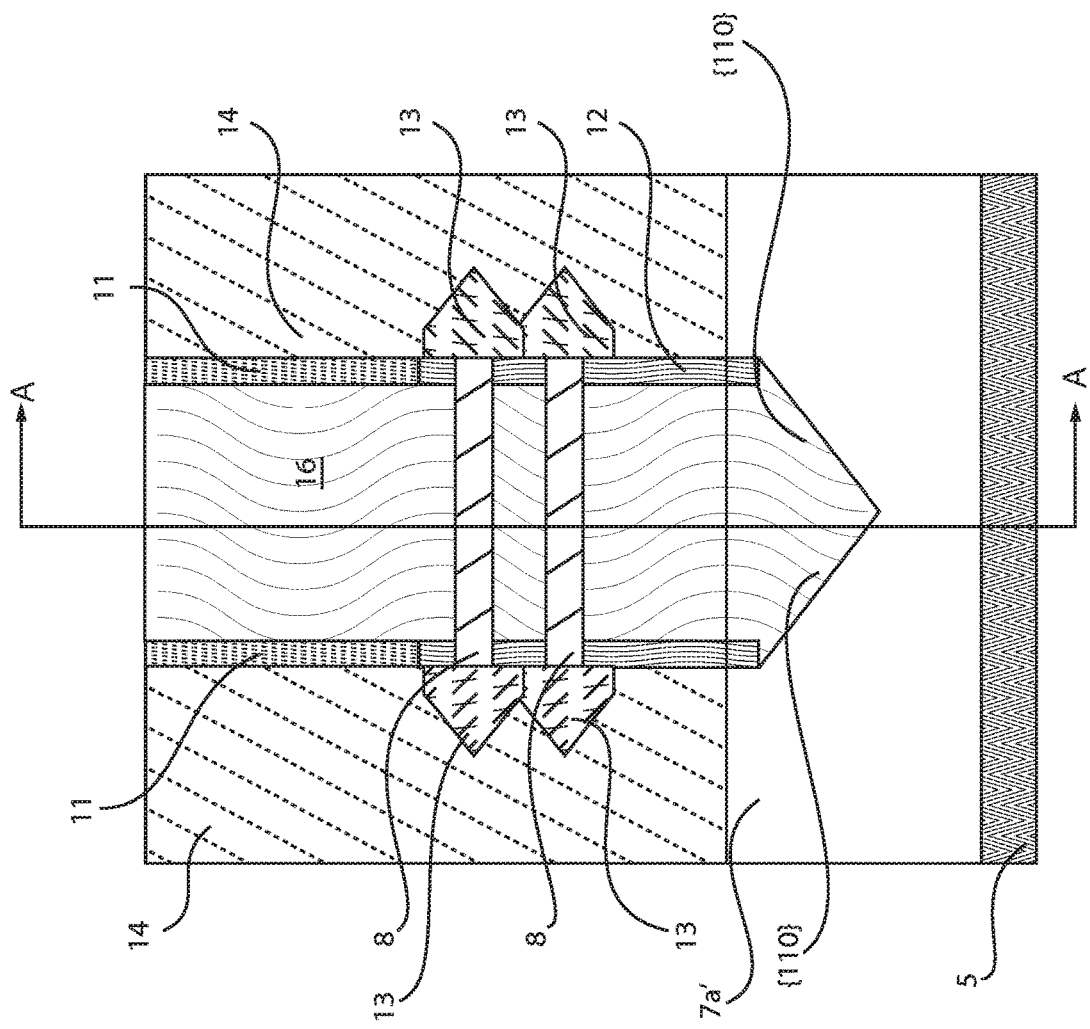
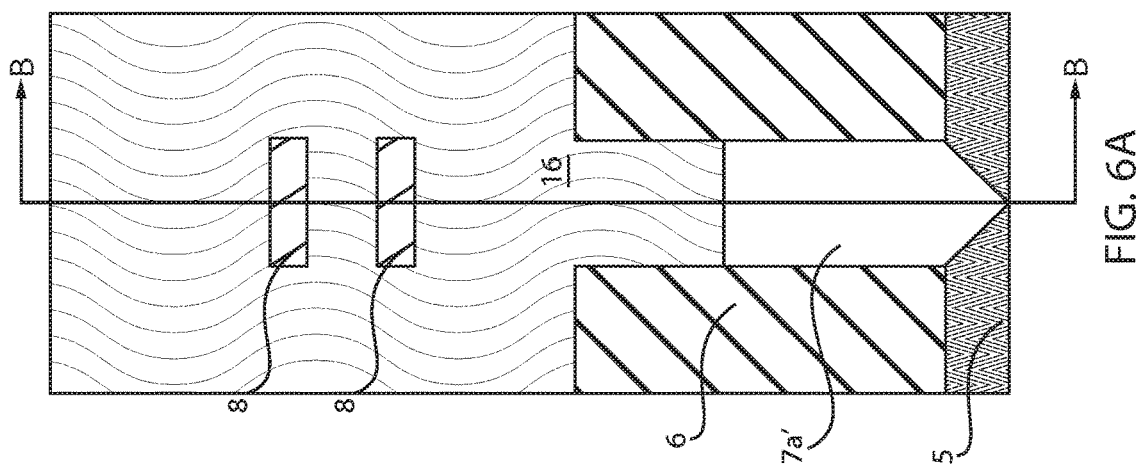
FIG. 6B
FIG. 6A

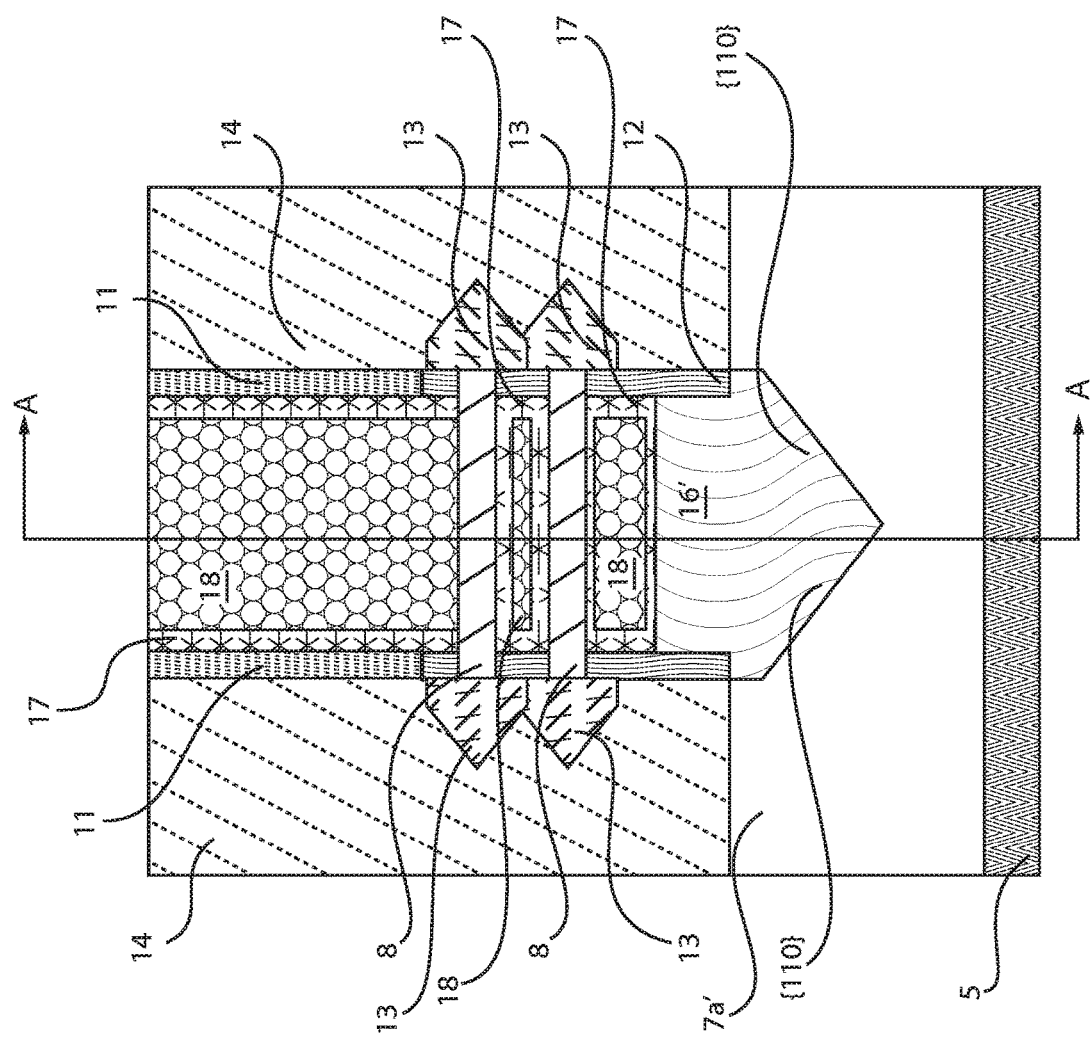
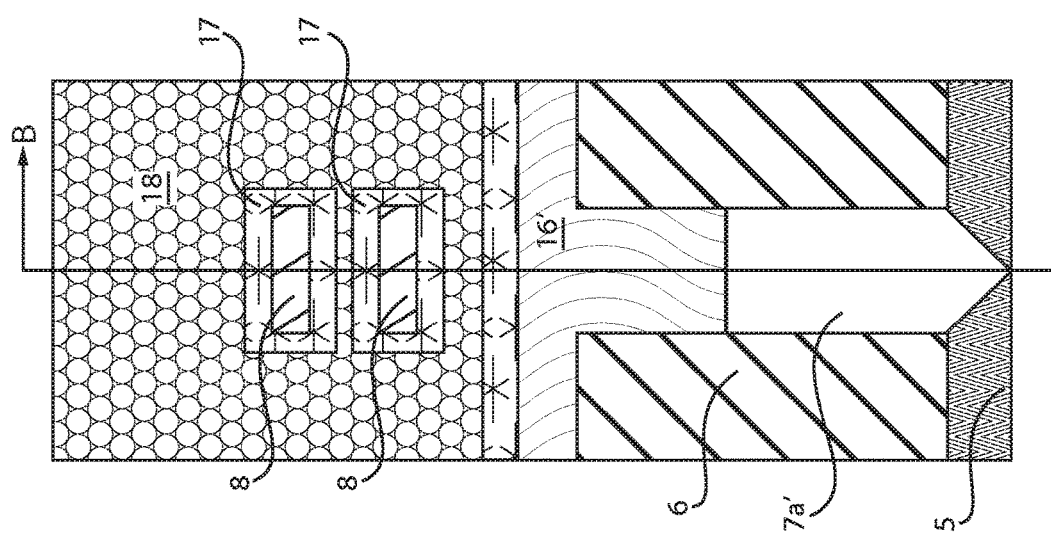
FIG. 8B
FIG. 8A

STACKED INDIUM GALLIUM ARSENIDE NANOSHEETS ON SILICON WITH BOTTOM TRAPEZOID ISOLATION

BACKGROUND

Technical Field

The present disclosure relates to semiconductor devices, and more particularly to semiconductor devices including channel regions integrated within nanosheets.

Description of the Related Art

With the continuing trend towards miniaturization of integrated circuits (ICs), there is a need for transistors to have higher drive currents with increasingly smaller dimensions. The use of non-planar semiconductor devices such as, for example, nano-sheet transistors can be the next step in the evolution of complementary metal oxide semiconductor (CMOS) devices.

SUMMARY

In one aspect, the present disclosure provides a method of forming a nanosheet semiconductor device. In one embodiment, the method of forming a nanosheet semiconductor device includes epitaxially forming a stack of at least two repeating nanosheets, the at least two repeating nanosheets including a first nanosheet layer of a first III-V semiconductor material and a second nanosheet layer of a second III-V semiconductor material. Source and drain regions are formed on the second nanosheet layer. The first nanosheet layer may be removed selectively to the second nanosheet layer. The etch process for removing the first nanosheet layer may be selective to facets of the material for the first nanosheet to provide an inverted apex at the base of the stack. A dielectric layer may be deposited filling the inverted apex. A functional gate structure for the nanosheet semiconductor device may then be formed to a channel region portion of the second nanosheet layer.

In another embodiment, the method for forming the nanosheet semiconductor device includes epitaxially forming a stack of at least two repeating nanosheets. The at least two repeating nanosheets including a first nanosheet layer of a first III-V semiconductor material and a second nanosheet layer of a second III-V semiconductor material. A sacrificial gate structure is formed on the stack of the at least two repeating nanosheets. Source and drain regions are epitaxially formed on the second nanosheet layer. The sacrificial gate structure is removed to provide a gate opening exposing channel region portions of the at least two repeating nanosheets. An etch process removes the first nanosheet layer selectively to the second nanosheet layer, wherein the etch process is selective to facets of the material for the first nanosheet layer to provide an inverted apex at the base of the stack. A dielectric layer is deposited filling the inverted apex. A functional gate structure is formed in the gate opening to the channel region portions of the second nanosheet layer.

In another aspect, a nanosheet semiconductor device is provided that includes at least one nanosheet of a first III-V semiconductor material with a gate structure all around a channel region of the at least one nanosheet of the first III-V semiconductor material. A trapezoid shaped dielectric material is present underlying the gate structure. The trapezoid shaped dielectric material is present between the gate structure and an underlying second III-V semiconductor material.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 5A is a side cross-sectional view of removing the sacrificial gate structure to provide a gate opening exposing channel region portions of the at least two repeating nanosheets; and removing a portion of the first nanosheet layer in the stack of the at least two repeating nanosheets selectively to the second nanosheet layer, wherein the etch process for removing the portion of the first nanosheet layer is selective to facets of the material for the first nanosheet to provide an inverted apex at the base of the stack, in accordance with one embodiment of the present disclosure.

FIG. 5B is a side cross-sectional view of the structure depicted in FIG. 5A along section line B-B.

FIG. 6A is a side cross-sectional view depicting depositing a dielectric layer filling the inverted apex region, in accordance with one embodiment of the present disclosure.

FIG. 6B is a side cross-sectional view of the structure depicted in FIG. 6A along section line B-B.

FIG. 8A is a side cross-sectional view depicting forming a functional gate structure on the channel region portions of the second nanosheet layer that is depicted in FIG. 7A.

FIG. 8B is a side cross-sectional view of the structure depicted in FIG. 8A along section line B-B.

DETAILED DESCRIPTION

Figure 1B:
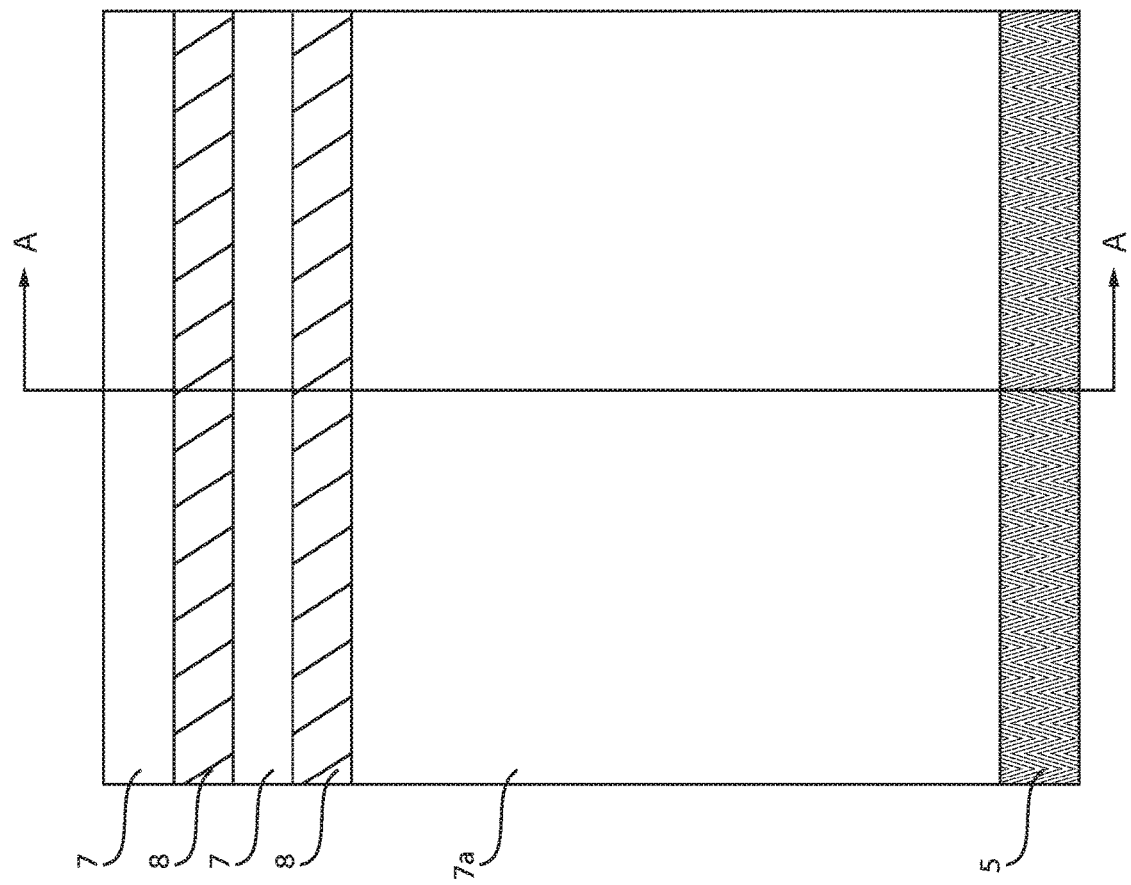
FIG. 1B is a side cross-sectional view of the structure depicted in FIG. 1A, the cross section taken along the length of the channel region of the nanosheet semiconductor device being formed.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describe nano-sheet transistors. Nanosheet (nanowire) MOSFET is a candidate for future CMOS technology. Nanosheet MOSFETs can provide better gate electrostatic control and larger effective device width per footprint (multiple nanosheets in one stack). The methods and structure provided herein can reduce the incidence of parasitic capacitance at the base of the nanosheets, in which by reducing the incidence of parasitic capacitance the methods and structures that are described herein increase device speed performance. In some embodiments, the methods and structures described herein can provide gate all around stacked nanosheet structures on silicon (Si) with indium phosphide (InP) selectively removed between sheets of indium gallium arsenide (InGaAs) using a wet chemical etchant of HCl forming facets having a {110} orientation along the gate length. Following removal of the indium phosphide (InP) portions, the space created by the etch process is field with a spin on dielectric. In some embodiments, the structure provided by the aforementioned process sequence products a trapezoid shaped isolating spin on dielectric at the bottom of the nanosheets. The trapezoid shaped isolating spin on dielectric at the bottom of the nanosheets isolate the gate from the bottom sheet of indium phosphide, hence eliminating parasitic capacitance. Further details regarding the method and structures of the present disclosure are now described with reference to FIGS. 1-9

Figure 1A:
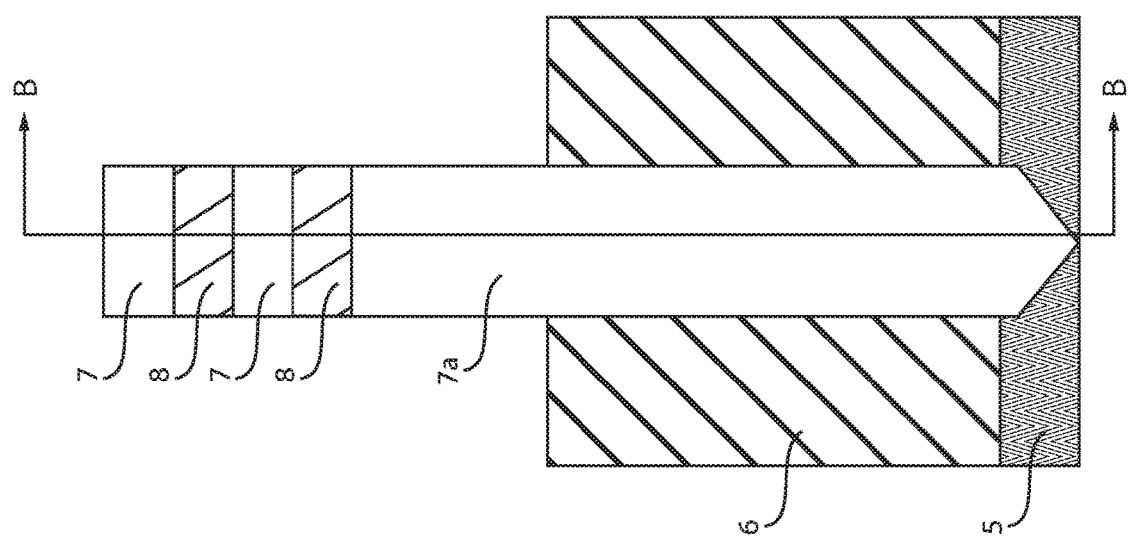
FIG. 1A is a side cross-sectional view of an initial structure for forming a nanosheet semiconductor device including an epitaxially formed stack of at least two repeating nanosheets of type III-V semiconductor materials formed atop a substrate of a type IV semiconductor substrate, the side-cross section taken across the length of the channel region of the nanosheet semiconductor device, in accordance with one embodiment of the present disclosure.

FIGS. 1A and 1B depict one embodiment of an initial structure for forming a nanosheet semiconductor device including an epitaxially formed stack of at least two repeating nanosheets 7, 8 of type III-V semiconductor materials formed atop a substrate of a type IV semiconductor substrate 5. The term "nanosheet" denotes a substantially two dimensional structure with thickness in a scale ranging from 1 to 100 nm. The width and length dimensions of the nanosheet may be greater than the width dimensions. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

The epitaxially formed stack of the at least two repeating nanosheets 7, 8 may be formed using a process that employs aspect ratio trapping (ART). In ART process, III-V semiconductor materials are epitaxially grown in a dielectric trench by using the exposed silicon at the trench bottom as the seed. Epitaxy defects due to the large lattice mismatch between epitaxial III-V semiconductor material and the semiconductor containing deposition surface is trapped in the lower portion of the trench, resulting in virtually defect-free III-V semiconductor material layers in upper portion of trench.

The semiconductor substrate 5 is typically a type IV semiconductor material. By "type IV semiconductor" it is meant that the semiconductor material includes at least one element from Group IVA (i.e., Group 14) of the Periodic Table of Elements. Examples of type IV semiconductor materials that are suitable for the semiconductor substrate 5 include silicon (Si), germanium (Ge), silicon germanium (SiGe), silicon doped with carbon (Si:C), silicon germanium doped with carbon (SiGe:C) and a combination thereof. In one example, the semiconductor substrate 5 is composed of silicon (Si) having a (100) crystalline orientation. The silicon can be single crystal silicon, which can also be referred to a monocrystalline silicon. The semiconductor substrate 5 may be a bulk substrate, but may also be provided by a silicon on insulator (SOI) substrate.

A dielectric layer 6 may be present atop the semiconductor substrate 5 having a fin opening that is present therethrough. The fin opening exposes a portion of the semiconductor substrate 5 that provides an epitaxial growth seed surface for forming the stack of the at least two repeating nanosheets 7, 8. The dielectric layer 6 may be composed of any dielectric material, such an oxide, nitride or oxynitride. For example, when the dielectric layer 6 is composed of an oxide, the oxide may be silicon oxide ($SiO_2$).

The fin opening may be formed using photolithography and etch processes. The fin opening typically has dimensions suitable for trapping defects when epitaxially growing the crystalline material, e.g., the type III-V semiconductor material of the subsequently formed functional fin structure, using ART (aspect ratio trapping) techniques. In such a case, the aspect ratio (AR—height/width) of the fin opening may be greater than 1, although it possible for the aspect ratio to be lower in ART devices, for example, the aspect ratio can be 0.5. (Aspect ratio is defined for trenches as the ratio of the trench height/trench width). In some embodiments, the aspect ratio of the trench is greater than 2:1.

In some embodiments, the stack of at least two repeating nanosheets 7, 8 of type III-V semiconductor materials is typically composed of two alternating materials. For, example, a first nanosheet layer 6 of a first III-V semiconductor material and a second nanosheet layer 7 of a second III-V semiconductor material. The first III-V semiconductor for the first nanosheet layer 7 may be composed of indium phosphide (InP), while the second nanosheet layer 8 may be composed of indium gallium arsenide (InGaAs).

It is noted that any material maybe employed for the second nanosheet layer 8 so long as material of the first nanosheet layer 7 may be removed selectively to the second nanosheet layer 8. Examples of other type III-V semiconductor materials that may be suitable for the second nanosheet layer 8 may include aluminum antimonide (AlSb), aluminum arsenide (AlAs), aluminum nitride (AlN), aluminum phosphide (AlP), gallium arsenide (GaAs), gallium phosphide (GaP), aluminum gallium arsenide (AlGaAs), gallium arsenide nitride (GaAsN), gallium arsenide antimonide (GaAsSb), aluminum gallium nitride (AlGaN), aluminum gallium phosphide (AlGaP), aluminum gallium arsenide phosphide (AlGaAsP), aluminum gallium arsenide nitride (AlGaAsN), gallium arsenide antimonide nitride (GaAsSbN), and combinations thereof.

It is noted that other materials may be employed for the material that provides the first nanosheet layer 7, so long as the material selected may be etched with a hydrochloric etch that is selective to facets of the material for the first nanosheet layer 7 having a {110} crystalline orientation. Examples of other type III-V semiconductor materials that may be suitable for the second nanosheet layer 8 may include indium antimonide (InSb), indium arsenic (InAs), indium nitride (InN), indium gallium phosphide (InGaP), indium gallium nitride (InGaN), indium arsenide antimonide (InAsSb), indium gallium antimonide (InGaSb), aluminum gallium indium phosphide (AlGaInP), indium gallium arsenide phosphide (InGaAsP), indium arsenide antimonide phosphide (InArSbP), aluminum indium arsenide phosphide (AlInAsP), indium gallium arsenide nitride (InGaAsN), indium aluminum arsenide nitride (InAlAsN), gallium indium nitride arsenide aluminum antimonide (GaInNAsSb), gallium indium arsenide antimonide phosphide (GaInAsSbP), and combinations thereof.

Although FIGS. 1A and 1B only depicts two semiconductor material layers in the stack of at least two repeating nanosheets 7, 8, it is noted that the present disclosure is not limited to only this example. Any number of semiconductor material layers may be present in the stack. For example, the number of semiconductor material layers in the stack may also be equal to 3, 4, 5, 10, 15 and 20, as well as any value between the aforementioned examples.

The stack 10 of the first nanosheet 7 and the second nanosheet 8 may be formed using an epitaxial deposition process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The term "epitaxial semiconductor material" denotes a semiconductor material that has been formed using an epitaxial deposition or growth process.

The type III-V semiconductor material may be formed by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHVCVD), molecular beam epitaxy (MBE), or atomic layer deposition (ALD). In the CVD process, selective epitaxial growth typically includes introducing a source gas into the chamber. The source gas may include at least one precursor gas and a carrier gas, such as, for example, hydrogen. The reactor chamber may be heated by, for example, RF-heating. The epitaxial growth system may be a single-wafer or multiple-wafer batch reactor. A number of different sources may be used for the deposition of epitaxial type III-V semiconductor material. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), tertiary-butylphosphine (TBP), phosphine ($PH_3$), ammonia ($NH_3$), and combinations thereof. The temperature for epitaxial deposition of type III-V semiconductor materials typically ranges from 300° C. to 900° C. Although higher temperature typically results in faster deposition, the faster deposition may result in crystal defects and film cracking.

In some embodiments, to provide the different semiconductor material layers for the first and second nanosheets 7, 8, the precursors for the two different type III-V semiconductor materials being epitaxially formed may be cycled. The thickness of each of the at least two semiconductor material layers, i.e., first III-V type semiconductor material and the second III-V type semiconductor material, may range from 1 nm to 30 nm. In another embodiment, the thickness of each of the first and second nanosheets 7, 8 may range from 5 nm to 20 nm.

In some embodiments, the first III-V type semiconductor material that provides the first nanosheet 7 includes a first portion 7a that is first deposited at a thickness to separate the second nanosheet 8 from the supporting substrate 5. Further, the thickness of the first portion 7a of the first type III-V semiconductor material for the first nanosheet 7 is the portion of the stack in which defects may be trapped, as part of the aspect ratio trapping (ART) process. Although defects may be present in the bottom trench portion of the fin opening, the defects are obstructed from reaching the upper trench portion in which the second nanosheet 8 is present using aspect ratio trapping (ART). More specifically, in some embodiments, defects, such as dislocation defects, in the type III-V semiconductor material formed on a type IV semiconductor seed layer of dissimilar lattice structure reach and terminate at the sidewalls of the portions fin opening, i.e., trench through the dielectric layer 6. Accordingly, although the III-V semiconductor material may include lattice defects at the base of the trench, the type III-V semiconductor material that provides the second nanosheets 8 is substantially free of crystalline defects.

In some embodiments, the amount of crystalline defects present in the second nanosheets 8 may be substantially 0. Various crystalline defects such as threading dislocations, stacking faults, twin boundaries, or anti-phase boundaries may thus be substantially eliminated from at least the lower most second nanosheet 8 are substantially free of defects.

The sidewalls of the stack of at least two repeating nanosheets 7, 7a, 8 may have sidewalls with a {110} crystalline orientation.

In some embodiments, after forming the stack of at least two repeating nanosheets 7, 7a, 8, the dielectric layer 6 may be recessed to expose the portion of the stack of nanosheets 7, 7a, 8 that the sacrificial gate structure 9 is present on as, well as the portions that the source and drain regions 13 are subsequently formed.

Figure 2B:
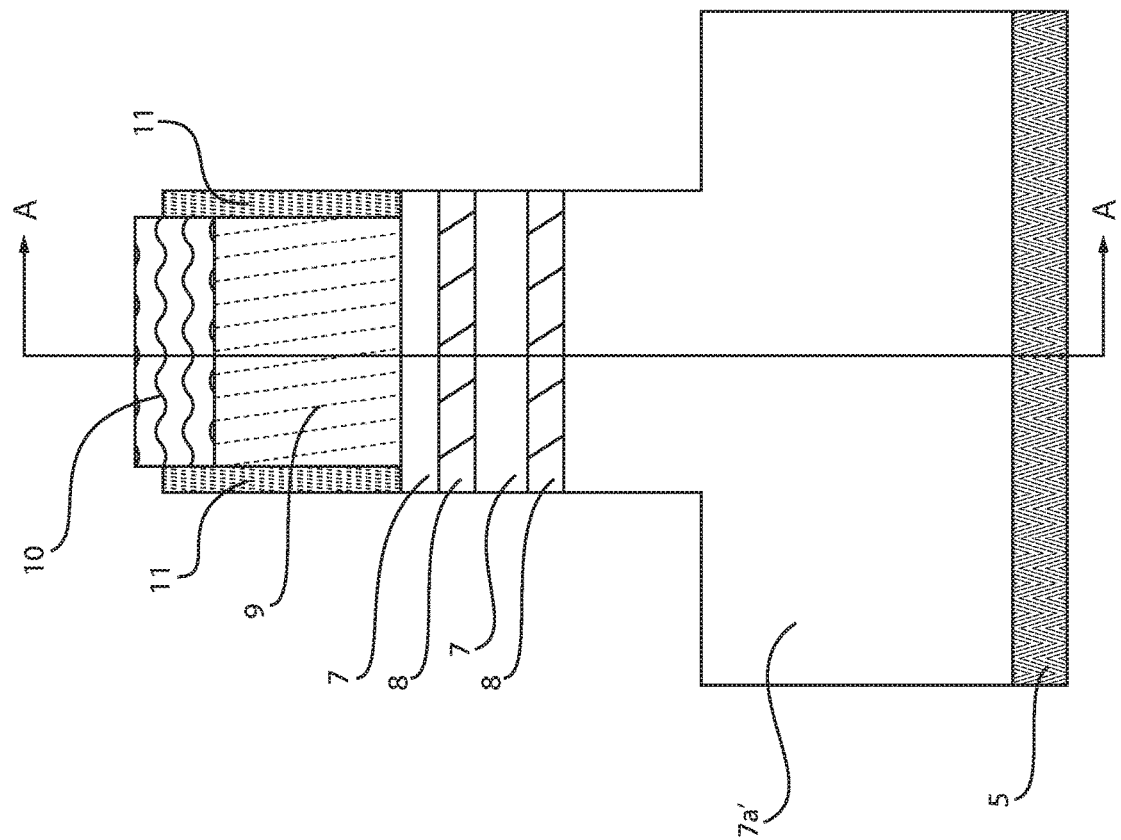
FIG. 2B is a side cross-sectional view of the structure depicted in FIG. 2A along section line B-B.
Figure 2A:
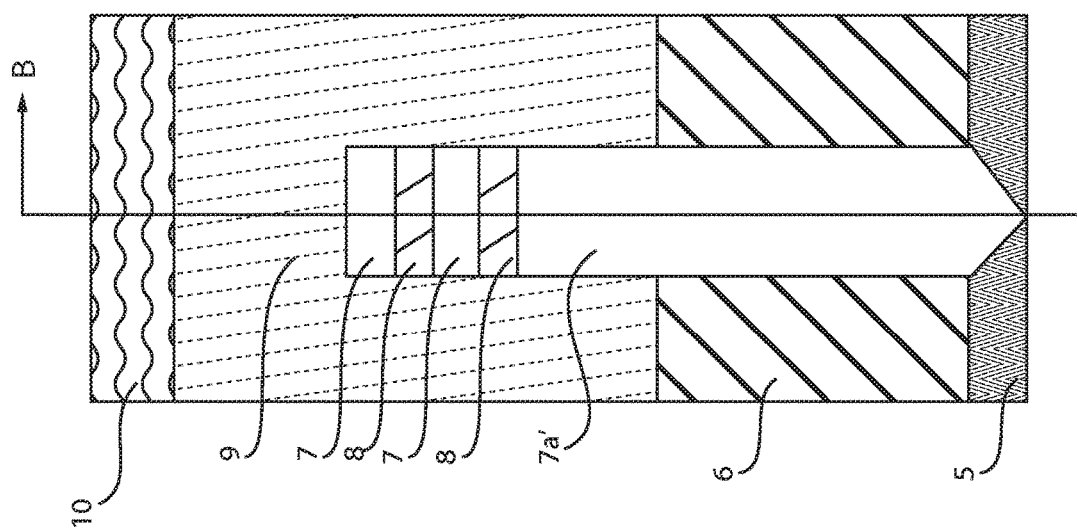
FIG. 2A is a side cross-sectional view depicting forming a sacrificial gate structure on the structure depicted in FIG. 1A, and patterning the stack of the at least two repeating nanosheets of type III-V semiconductor materials.

FIGS. 2A and 2B depict forming a sacrificial gate structure 9 on the structure depicted in FIGS. 1A, and 1B. The sacrificial gate structure 9 may include a sacrificial gate cap 10. The sacrificial gate structure 9 can be formed on a channel portion of the stack of the at least two repeating nanosheets 7, 8 of type III-V semiconductor materials. By "sacrificial" it is meant that the structure is present during processing of the semiconductor device, but is removed from the semiconductor device prior to the device being completed. In the present process flow, a sacrificial gate structure 9 is employed as part of a replacement gate process. As used herein, the term "sacrificial gate structure" denotes a sacrificial structure that dictates the geometry and location of the later formed functioning gate structure. The "functional gate structure" operates to switch the semiconductor device from an "on" to "off" state, and vice versa.

In one embodiment, the sacrificial material that provides the sacrificial gate structure 9 may be composed of any material that can be etched selectively to the at least one of the material layers of the at least two repeating nanosheets 7, 8 of type III-V semiconductor materials. In one embodiment, the sacrificial gate structure 9 may be composed of a silicon-including material, such as polysilicon. In another embodiment, the sacrificial gate structure 9 may be composed of a dielectric material, such as an oxide, nitride or oxynitride material, or amorphous carbon. The sacrificial gate structure 9 may be formed using deposition (e.g., chemical vapor deposition or spinning of a flowable dielectric) photolithography and etch processes (e.g., reactive ion etching). A sacrificial gate cap 10 may be present atop the sacrificial gate structure 9. The sacrificial gate cap 10 may be a dielectric, such as an oxide, e.g., silicon oxide, or a nitride, such as silicon nitride. The sacrificial gate cap 10 may be used in the process sequence for forming the sacrificial gate structure 9.

In some embodiments, the sacrificial gate structure 9 may be composed of a nitride, amorphous silicon, hydrogen silsesquioxane (HSQ), silicon oxide (Sift), hafnium oxide (HfO$_2$), or a combination thereof.

Still referring to FIGS. 2A and 2B, a cladding spacer 11 is formed on the sidewall of the sacrificial gate structure 9. The cladding spacer 11 is typically composed of a dielectric material, such as an oxide, nitride, or oxynitride material. In one example, when the spacer 11 is composed of a nitride, the cladding spacer 11 may be composed of silicon nitride, and when the spacer 11 is composed of oxide, the cladding spacer 11 may be composed of silicon oxide. In another example, the cladding spacer 11 may be composed of a low-k dielectric. In some examples, the low-k dielectric of the cladding spacer 11 may have a dielectric constant of 4.0 or less (measured at room temperature, e.g., 25° C., and 1 atm). For example, a low-k dielectric material suitable for the spacer 11 may have a dielectric constant ranging from about 1.0 to about 3.0. Examples of low-k materials suitable for the cladding spacer 11 include organo silicate glass (OSG), fluorine doped silicon dioxide, carbon doped silicon dioxide and combinations thereof.
In one example, the cladding spacer is comprised of silicon nitride or silicon boron carbon nitride (SiBCN).

The cladding spacer 11 may be formed using a deposition process, such as chemical vapor deposition (CVD), and an anisotropic etchback method. The cladding spacer 11 may be present on the sidewalls of the sacrificial gate structure 9, and may have a thickness ranging from 1 nm to 15 nm.

FIGS. 2A and 2B also depict etching the exposed portions of the stack of at least two repeating nanosheets 7, 7a, 8, that extend beyond the outer sidewall of the cladding spacer 20. In some embodiments, the etch process for removing the exposed portions of the stack of at least two repeating nanosheets 7, 7a, 8 is an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. In some embodiments, the etch process for etching the stack is a timed etch. In the embodiment that is depicted in FIG. 3, the etch process etches into the first portion 7a of the first III-V type semiconductor material that provides the first nanosheet 7, as depicted in FIG. 2B.

Figure 3:
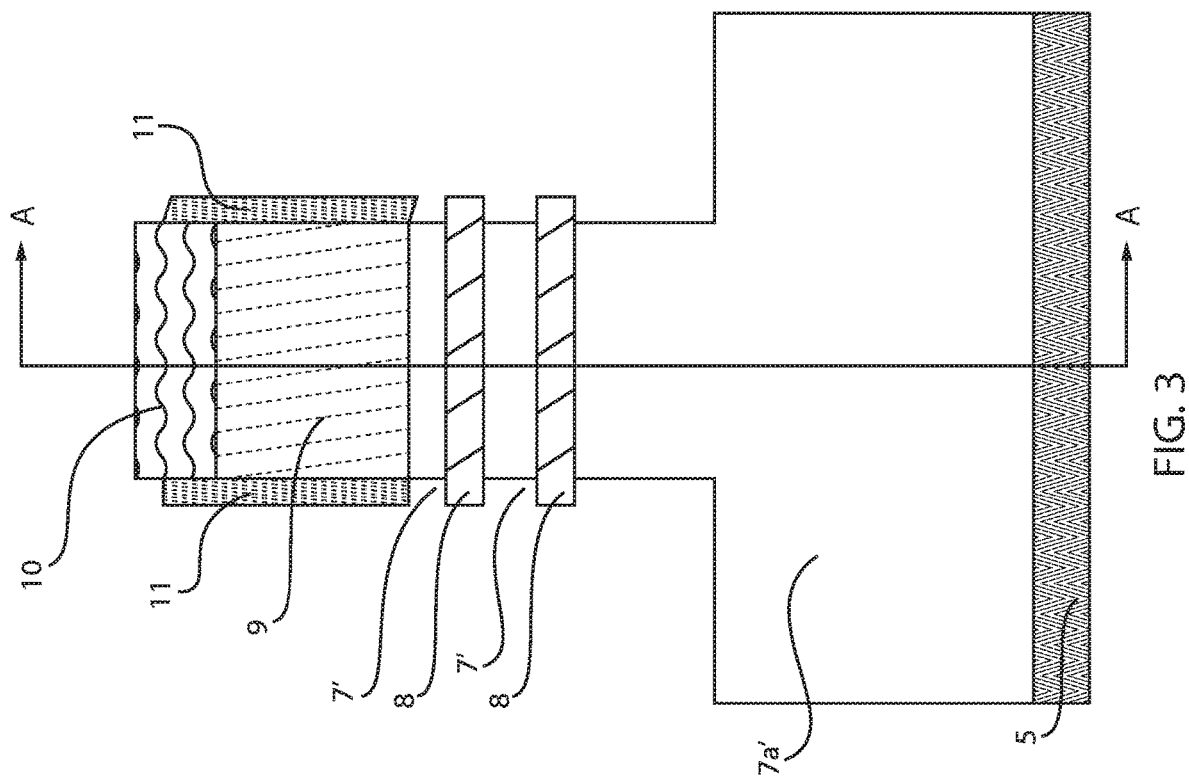
FIG. 3 is a side cross-sectional view depicting isotopically etching the first nanosheet layer of the structure depicted in FIG. 2B to form undercut regions underlying the second nanosheet layer, in accordance with one embodiment of the present disclosure.

FIG. 3 depicts one embodiment of isotopically etching the first nanosheet layer 7 of the structure depicted in FIG. 2B to form undercut regions underlying the second nanosheet layer 8. The etch process for forming the undercut regions may be a selective etch process. For example, the etch process for removing the first III-V type semiconductor material for the first nanosheet 7 may remove that material selectively to the second III-V semiconductor material for the second nanosheet 8. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1. The etch process forms the undercut region by isotropically etching the first nanosheet 7', 7a' selectively to the second nanosheet 8 may also be selective to the cladding spacer 11, as depicted in FIG. 3.

Figure 4:
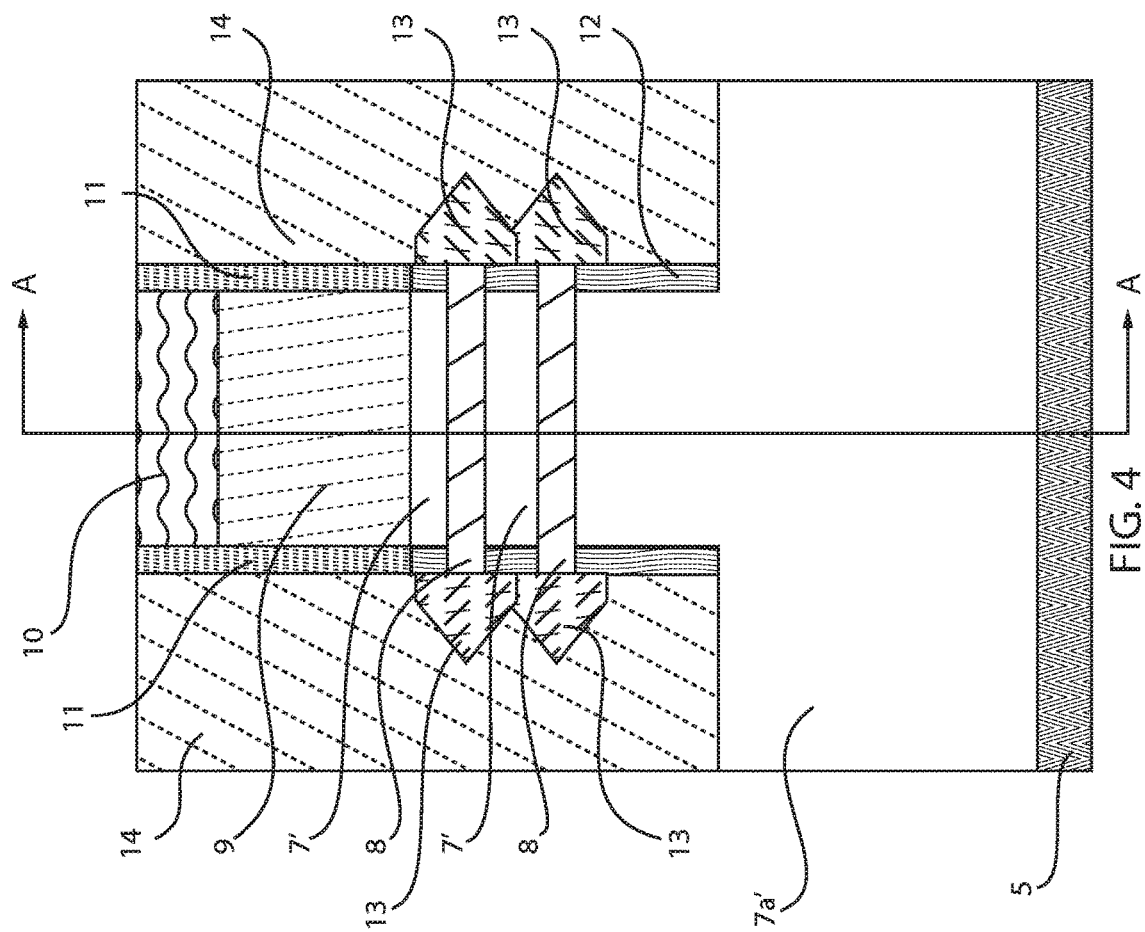
FIG. 4 is a side cross-sectional view depicting one embodiment of forming an inner spacer on etched surfaces of the first nanosheet layer that provide the undercut regions, and epitaxially growing the source and drain regions on exposed surfaces of the second nanosheet layer, in accordance with the present disclosure.

FIG. 4 depicts one embodiment of forming an inner spacer 12 on etched surfaces of the first III-V semiconductor material for the first nanosheet layer 7', 7a' that provide the undercut regions, and epitaxially growing the source and drain regions 13 on exposed surfaces of the second nanosheet 8. The inner spacer 12 is similar to the cladding spacer 12. For example, the inner spacer 12 may be composed of a low-k dielectric material. Examples of low-k dielectric materials that are suitable for the inner spacer 12 have been provided above for the cladding layer 11. In other embodiments, the inner spacer 12 may be composed of silicon nitride or silicon carbon boron nitride. The deposition process for forming the inner spacer 12 may include chemical vapor deposition, e.g., metal organic chemical vapor deposition (MOCVD) and/or plasma enhanced chemical vapor deposition (PECVD). The process sequence for forming the inner spacer 12 may also include an etch back process to provide that the ends of the second nanosheet layer 8 remain exposed.

FIG. 5 depicts one embodiment of forming epitaxial semiconductor material for the source and drain regions 13 on the exposed ends of the second nanosheet layer 8. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The epitaxial semiconductor material for the source and drain regions 13 may be composed of a type III-V semiconductor material. For example, the epitaxial semiconductor material that provides the source and drain regions 13 can be indium gallium arsenide (InGaAs). Indium gallium arsenide (InGaAs) is only one example of a base composition for the source and drain regions 13. The present disclosure is not limited to only this example for the composition of the source and drain regions 13. For example, the base composition for the source and drain regions 13 may be any of the epitaxially formed III-V semiconductor materials that have been described above for the first and second nanosheets 7', 8 that have been described above with reference to FIGS. 1A and 1B. The epitaxial deposition process for forming the source and drain regions 13 is a selective deposition process. More specifically, the epitaxial semiconductor material for the source and drain regions 13 may be epitaxially formed on the exposed ends of the second nanosheet layer 8 that is composed of a semiconductor material, but the epitaxial semiconductor material for the source and drain regions 13 is not formed on the dielectric surfaces of the cladding spacer 11 or the inner spacer 12.

Epitaxial deposition may be carried out in a chemical vapor deposition apparatus, such as a metal organic chemical vapor deposition (MOCVD) apparatus or a plasma enhanced chemical vapor deposition (PECVD) apparatus. The epitaxial semiconductor material for the source and drain regions 13 may be in situ doped to a p-type or n-type conductivity. As used herein, "p-type" refers to the addition of impurities to an intrinsic semiconductor that creates deficiencies of valence electrons. As used herein, "n-type" refers to the addition of impurities that contributes free electrons to an intrinsic semiconductor. In some embodiments, the dopant that provides the n-type or p-type conductivity type of the source and drain regions 13 may be composed of silicon (Si), selenium (Se), zinc (Zn) and combinations thereof.

The term "in situ" denotes that a dopant, e.g., n-type or p-type dopant, is introduced to the base semiconductor material, e.g., type III-V semiconductor material, during the formation of the base material. For example, an in situ doped epitaxial semiconductor material may introduce n-type or p-type dopants to the material being formed during the epitaxial deposition process that includes n-type or p-type source gasses. In one embodiment, in which the source and drain regions 13 are composed of type III-V semiconductor material and are in-situ doped during the epitaxial deposition process to provide the source and drain regions 13 having the p-type or n-type conductivity, the dopant gas may be selected from the group consisting of bis-cyclopentadienyl-magnesium ($Cp_2Mg$), silane ($SiH_4$), disilane ($Si_2H_6$), germane ($GeH_4$), carbon tetrabromide ($CBr_4$) and combinations thereof.

The dopant for the epitaxial semiconductor material of the source and drain regions 13 that dictates the conductivity type of the source and drain regions 13 may be present in a concentration ranging from $5\times10^{19}$ atoms/$cm^3$ to $5\times10^{20}$ atoms/$cm^3$. In one example, the dopant for the epitaxial semiconductor material of the source and drain regions 13 that dictates the conductivity type of the source and drain regions 13 is present in a concentration equal to $1\times10^{20}$ atoms/$cm^3$.

FIGS. 5A and 5B depict removing the sacrificial gate structure 9, as well as the sacrificial gate cap 10, to provide a gate opening exposing channel region portions of the at least two repeating nanosheets 7', 8. In some embodiments, removing the replacement gate structure 9 may begin with forming an interlevel dielectric layer 14 on the structure depicted in FIG. 4 and planarizing the interlevel dielectric layer 14 to expose an upper surface of the sacrificial dielectric cap 10 that is overlying the sacrificial gate structure 9. The sacrificial dielectric cap 10 and the sacrificial gate structure 9 may then be removed using a wet or dry etch process. In one embodiment, the sacrificial dielectric cap 10 and the sacrificial gate structure 9 may be removed by at least one of an anisotropic etch process, such as reactive ion etch (RIE), or an isotropic etch process, such as a wet chemical etch. In one example, the etch process for removing the sacrificial gate cap 10 and the sacrificial gate structure 9 can include an etch chemistry that is selective to the at least the material layers for the second nanostructure 8 of the stack of the at least two repeating nanosheets 7', 8 of type III-V semiconductor materials. The etch process for removing the sacrificial gate cap 10 and the sacrificial gate structure 9 may also be selective to the cladding spacer 11 and the inner spacer 12.

Removing the sacrificial gate structure 9 produces a gate opening 15 that exposes a channel portion of the stack 10 of the two semiconductor materials 5a, 5b.

FIGS. 5A and 5B also depict removing the first nanosheet 7' and a portion of the first portion of the first III-V semiconductor material 7a' in the stack of the at least two repeating nanosheets 7', 8. The first III-V semiconductor material of the first nanosheet 7', 7a' may be removed selectively to the second III-V semiconductor material of the second nanosheet layer 8. The etch process for removing the portion of the first nanosheet layer 7' is selective to facets of the material for the first nano sheet to provide an inverted apex region 15' at the base of the stack.

In some embodiments, the etch process for removing the first III-V semiconductor material, e.g., indium phosphide (InP), that provides the first nanosheet 7', and the portion of the first portion of the first III-V semiconductor material 7a', selectively to the second III-V semiconductor material, e.g., indium gallium arsenide (InGaAs), is a wet chemical etch that includes hydrochloric (HCl) acid. The hydrochloric (HCl) acid etch may include 18.5% hydrochloric (HCl) acid. The hydrochloric (HCl) acid etch composition is selective to {110} crystal plane of the first III-V semiconductor, e.g., indium phosphide (InP), that provides the first nanosheet 7' and the first portion of the first III-V semiconductor material 7a' that separates the second nanosheet 8 from the support substrate 5.

In some embodiments, the selective etch of the first III-V semiconductor material of the indium phosphide (InP) for the first III-V semiconductor material stops at an angle of approximately 45 degrees. This corresponds to a plane belonging to the {110} family for the first III-V semiconductor material, e.g., indium phosphide (InP).

The selective nature of the HCl etch to the indium containing first III-V semiconductor material provides an inverted apex region 15' at the base of the gate opening 15 that is subsequently filled with a dielectric to provide a bottom trapezoid isolation region 16 that is positioned at the base of the gate structure, and separates the gate structure from the remaining portion of the first III-V semiconductor material 7a. The presence of the bottom trapezoid isolation region eliminates the parasitic bottom capacitance of the nanosheet semiconductor device that includes the second nanosheets 8. By eliminating the bottom parasitic capacitance, these methods and structures provided herein enhance device speed.

The selective etch to the facets, e.g., semiconductor planes having {110} crystalline orientation, provide an inverted triangle shape, in which the sidewalls provided by the facets intersect at an apex providing the lowermost surface within the gate opening 15, as depicted in FIGS. 5A and 5B.

In the example depicted in FIGS. 5A and 5B, following removal of first nanosheet layers 7' of the stack, a suspended channel structure is provided by the remaining second nanosheet layers 8. By "suspended channel" it is meant that at least one semiconductor material layer is present overlying the substrate 5, wherein the sidewalls of the suspended channel are supported, e.g., anchored, in the inner spacer 12. It is noted that the cross-section depicted in FIG. 5A, illustrates the suspended channels, as the cross-section is through the center of the length of the channel regions at which the inner spacer 12 is not present.

Gate structure materials, electrically conductive materials and/or semiconductor materials may be formed in the space surrounding the suspended structures, and are referred to as gate all around (GAA) gate structures.

Although FIGS. 5A and 5B depict two suspended channel structures, the present disclosure is not limited to only this embodiment. Any number of suspended channel structures, such as suspended nanosheets, may be formed using the methods and structures provided by the present disclosure.

FIGS. 6A and 6B depict depositing a dielectric layer 16 filling the inverted apex region 15'. In some embodiment, the dielectric layer 16 is deposited using a spin on deposition method. Spin on deposition methods can include processes that employ a dielectric that is deposited in liquid form, in which the substrate 5 on which the dielectric is deposited is spun for distribution of the liquid dielectric material being deposited. For example, the liquid dielectric may be spun to provide a uniform distribution. The substrate 5, which includes the overlying structures depicted in FIGS. 5A and 5B can be spun up to 6,000 rpm. Following initial deposition of the liquid dielectric, the material may be solidified using a low temperature bake, which can be at temperatures less than 200° C. In other embodiments, the liquid dielectric can be cured using UV curing.

Some examples of silicon based polymeric dielectric materials suitable for the dielectric layer 16 include hydrogen silsesquioxane (HSQ) and spin on glass (SOG), e.g., methylsilsesquioxane (MSQ). Other examples of spin on dielectric of spin-on organic low-κ polymers that can be used for the dielectric 16 for filling the inverted apex region 15' include polyimide, polynorbornenes, benzocyclobutene, and PTFE. Depositing the dielectric 16 is not limited to only spin on deposition methods. For example, the dielectric layer 16 may also be deposited using chemical vapor deposition (CVD) processes, such as plasma enhanced chemical vapor deposition (PECVD).

Figure 7B:
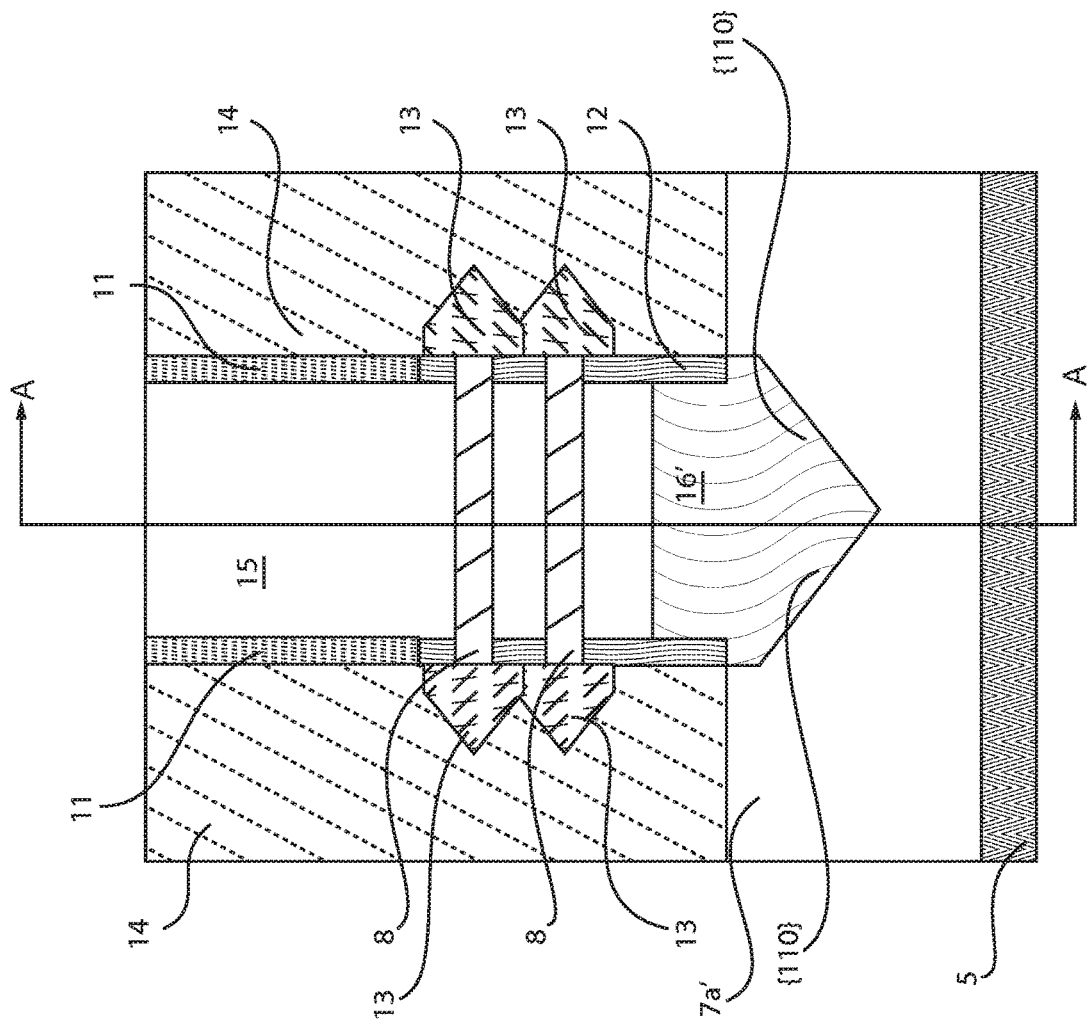
FIG. 7B is a side cross-sectional view of the structure depicted in FIG. 7A along section line B-B.
Figure 7A:
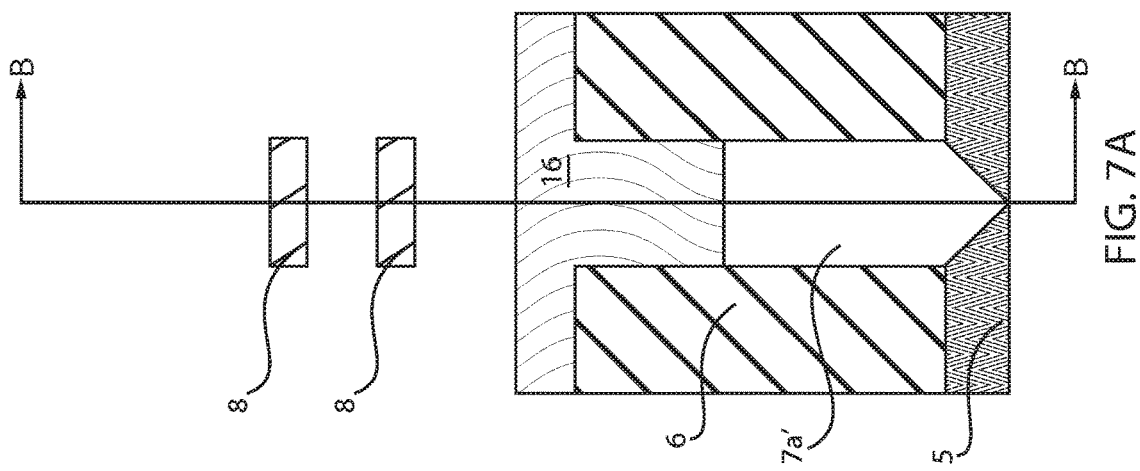
FIG. 7A is a side cross-sectional view depicting recessing the dielectric layer that is filling the inverted apex region of the structure depicted in FIG. 6A.

FIGS. 7A and 7B depict recessing the dielectric layer 16 that is filling the inverted apex region 15' of the gate opening 15. The dielectric layer 16 may be recessed by an etch process, such as a wet chemical etch, plasma etch, and/or reactive ion etching (RIE). The dielectric layer 16 may be recessed to a height within the gate opening 15 to provide the level at which the base of the gate structure is present. The remaining portion of the dielectric layer 16 that fills the inverted apex region 15' of the gate opening 15 provides the bottom trapezoid shaped isolation region 16' that substantially eliminates the parasitic capacitance in the nanosheet device by isolating the gate structure from the nanosheets 8 that provide the channel regions of the device.

FIGS. 8A and 8B depict forming a functional gate structure on the channel region portions of the second nanosheet layer 8 that is depicted in FIG. 7A. The functional gate structure includes a gate dielectric 17 and a gate conductor 18. The functional gate structure functions to switch the device from the ON state to the OFF state, and vice versa. The gate dielectric 17 can be formed on the entirety of the exterior surface of the suspended channel structures 8. The at least gate dielectric 17 may comprise a semiconductor oxide, semiconductor nitride, semiconductor oxynitride, or a high k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, SiON, $SiN_x$, a silicate thereof, and an alloy or stacked thereof. Each value of x is independently from 0.5 to 3 and each value of y is independently from 0 to 2. The at least one gate dielectric 17 can be formed by chemical vapor deposition (CVD), such as plasma enhanced chemical vapor deposition (PECVD), metal organic chemical vapor deposition (MOCVD), or atomic layer deposition (ALD). In another embodiment, the at least one gate dielectric can be formed using thermal growth methods, such as oxidation.

The at least one gate conductor 18 that is formed on the at least one gate dielectric may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The at least one gate conductor can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. In some embodiments, the at least one gate conductor may include a doped semiconductor material, e.g., n-type or p-type doped semiconductor material. For example, the at least one gate conductor 18 may be composed of polysilicon, which can be doped within an appropriate impurity by utilizing either an in-situ doping deposition process or by utilizing deposition, followed by a step, such as ion implantation or gas phase doping, in which the appropriate impurity is introduced into the polysilicon.

Figure 9:
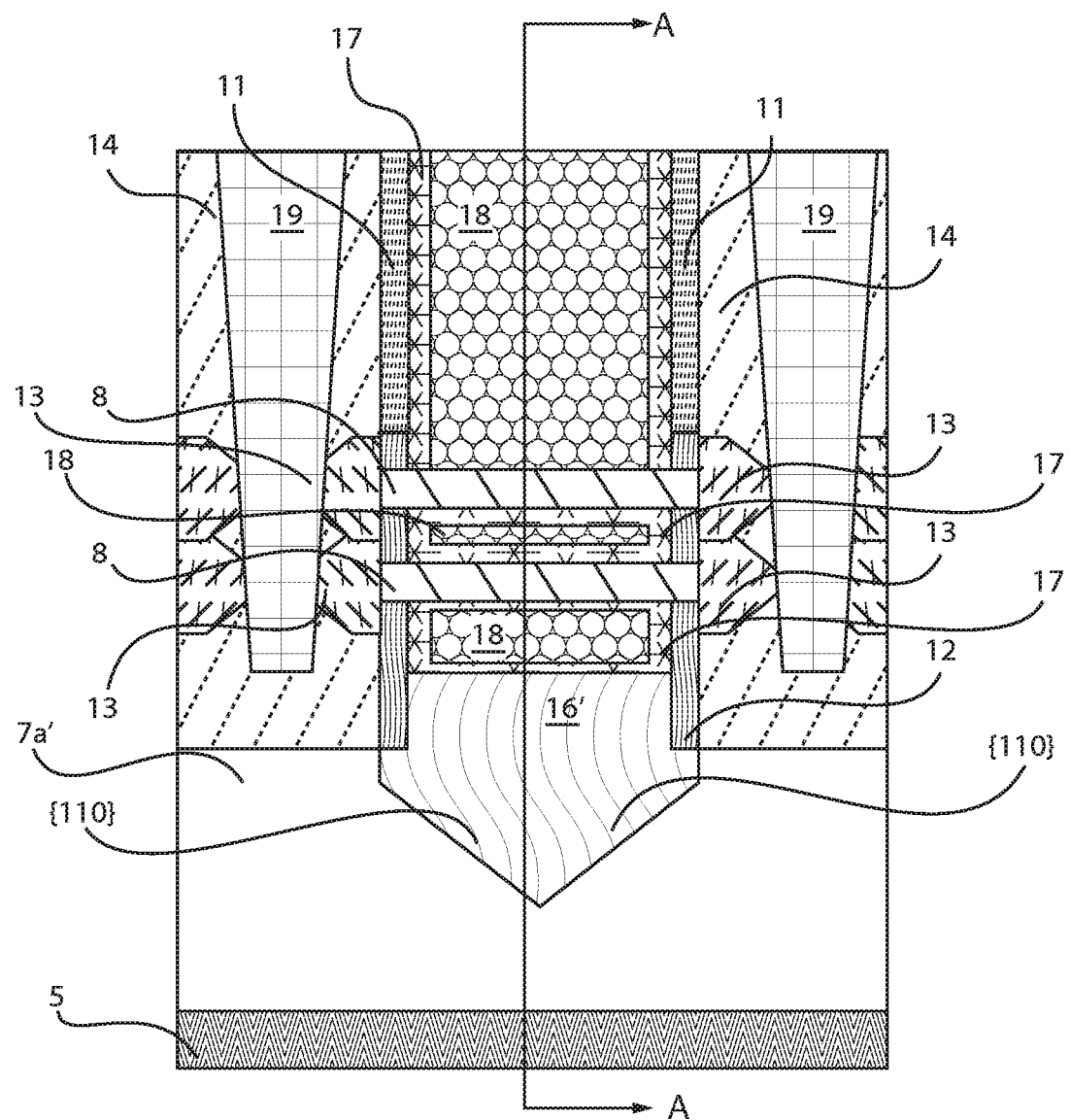
FIG. 9 is a side cross-sectional view depicting forming contacts to the structure depicted in FIG. 8B, in accordance with one embodiment of the present disclosure.

FIG. 9 depicts one embodiment of forming contacts 19 to the source and drain regions 13 of the device. Forming contacts 19 may begin with forming a via opening in the interlevel dielectric layer 14, and filling the via opening with an electrically conductive material. In some embodiments, the via opening may be formed using pattern and etch processing. The electrically conductive material may be a metal, such as tungsten, titanium, aluminum, copper or a combination thereof, which may be deposited using a method, such as physical vapor deposition, e.g., plating and/or sputtering.

FIG. 9 depicts one embodiment of a nanosheet semiconductor device that includes at least one nanosheet 8 of a III-V semiconductor material, e.g., indium gallium arsenide (InGaAs). A gate structure 17, 18 may be present all 8 around a channel region of the at least one nanosheet of the III-V semiconductor material. The gate structure 17, 18 may be a gate all around (GAA) gate structure. A trapezoid shaped dielectric material 16' may be present underlying the gate structure 17, 18, wherein the trapezoid shaped dielectric material 16' is present between the gate structure and a III-V semiconductor material layer 7a' having a different composition than the at least one nanosheet of the III-V semiconductor material. The III-V semiconductor material layer underlying the trapezoid shaped dielectric material 16' may be indium phosphide (InP). The trapezoid shaped dielectric material 16' have a base provided by an apex, wherein the sidewalls of the base to the apex are in direct contact with the facets of the indium phosphide (InP) material have a crystalline orientation of {110}.

The methods and structures that have been described above with reference to FIGS. 1-9 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a nanosheet semiconductor device comprising:
    epitaxially forming a stack of at least two repeating nanosheets, the at least two repeating nanosheets including a first nanosheet layer of a first III-V semiconductor material and a second nanosheet layer of a second III-V semiconductor material;
    forming source and drain regions on the second nanosheet layer;
    removing a portion of the first nanosheet layer in the stack of the at least two repeating nanosheets selectively to the second nanosheet layer, wherein the etch process for removing the portion of the first nanosheet layer is selective to facets of the material for the first nanosheet layer to provide an inverted apex at the base of the stack; and
    depositing a dielectric layer filling the inverted apex region.
2. The method of claim 1, wherein the first III-V semiconductor material is indium phosphide (InP).
3. The method of claim 1, wherein the second III-V semiconductor material is comprised of indium gallium arsenide (InGaAs).
4. The method of claim 1, wherein the stack of the at least two repeating nanosheets comprises epitaxial growth on a silicon substrate having a (100) orientation.
5. The method of claim 4, wherein the stack being is grown in a trench extending through a dielectric layer.
6. The method of claim 5, wherein the stack of the at least two repeating nanosheets is formed using aspect ratio trapping to reduce defect formation.
7. The method of claim 1, wherein said forming the source and drain regions on the second nanosheet layer comprises:
    etching exposed portions of the stack of the at least two repeating nanosheets with an anisotropic etch process;
    isotopically etching the first nanosheet layer to form undercut regions underlying the second nanosheet layer;
    forming an inner spacer on etched surfaces of the first nanosheet layer that provide the undercut regions; and
    epitaxially growing the source and drain regions on exposed surfaces of the second nanosheet layer.
8. The method of claim 1, wherein said removing the portion of the first nanosheet layer of indium phosphide (InP) in the stack of the at least two repeating nanosheets selectively to the second nanosheet layer of indium gallium arsenide (InGaAs) comprise a wet chemical etch of hydrochloric acid (HCl).
9. The method of claim 8, wherein the etch process is selective to facets of indium phosphide having a {110} crystalline orientation.
10. The method of claim 1, wherein said depositing the dielectric layer filling the inverted apex region includes spin on deposition following by an etch to recess the deposited material.
11. A method of forming a nanosheet semiconductor device comprising:
    forming a stack of at least two repeating nanosheets, the at least two repeating nanosheets including a first nanosheet layer of a first III-V semiconductor material and a second nanosheet layer of a second III-V semiconductor material;
    forming source and drain regions on the second nanosheet layer;
    removing a portion of the first nanosheet layer in the stack of the at least two repeating nanosheets selectively to the second nanosheet layer, wherein the etch process for removing the portion of the first nanosheet layer is selective to facets of the material for the first nanosheet to provide an inverted apex at the base of the stack; and
    depositing a dielectric layer filling the inverted apex region.
12. The method of claim 11, wherein the first III-V semiconductor material is indium phosphide (InP).
13. The method of claim 12, wherein the second III-V semiconductor material is comprised of indium gallium arsenide (InGaAs).
14. The method of claim 13, wherein said removing the portion of the first nanosheet layer of indium phosphide (InP) in the stack of the at least two repeating nanosheets selectively to the second nanosheet layer of indium gallium arsenide (InGaAs) comprise a wet chemical etch of hydrochloric acid (HCl).
15. The method of claim 14, wherein the etch process is selective to facets of indium phosphide having a {110} crystalline orientation.
16. The method of claim 15, wherein the dielectric layer filling the inverted apex is trapezoid shaped dielectric material have a base provided by the apex.
17. The method of claim 16, wherein the sidewalls of the base to the apex are in direct contact with the facets of the indium phosphide (InP) material have a crystalline orientation of {110}.
18. The method of claim 11, wherein the source and drain regions are composed of epitaxial merged material between at least two nanosheets of the III-V semiconductor material.
19. The method of claim 11, wherein the stack of at least two repeating nanosheets is present atop a substrate of a type IV semiconductor material.

20. The method of claim 11, wherein the type IV semiconductor material is silicon (Si) having a (100) orientation.

* * * * *